United States Patent
Uehara et al.

(10) Patent No.: US 11,968,902 B2
(45) Date of Patent: Apr. 23, 2024

(54) PIEZOELECTRIC BODY AND MEMS DEVICE USING SAME

(71) Applicant: NATIONAL INSTITUTE OF ADVANCED INDUSTRIAL SCIENCE AND TECHNOLOGY, Tokyo (JP)

(72) Inventors: Masato Uehara, Tosu (JP); Hiroshi Yamada, Tosu (JP); Morito Akiyama, Tosu (JP); Sri Ayu Anggraini, Tosu (JP); Kenji Hirata, Tosu (JP)

(73) Assignee: NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 454 days.

(21) Appl. No.: 17/276,464

(22) PCT Filed: Nov. 26, 2019

(86) PCT No.: PCT/JP2019/046052
§ 371 (c)(1),
(2) Date: Mar. 15, 2021

(87) PCT Pub. No.: WO2020/121796
PCT Pub. Date: Jun. 18, 2020

(65) Prior Publication Data
US 2022/0037582 A1 Feb. 3, 2022

(30) Foreign Application Priority Data
Dec. 11, 2018 (JP) .................. 2018-231681

(51) Int. Cl.
*H01L 41/18* (2006.01)
*B81B 3/00* (2006.01)
(Continued)

(52) U.S. Cl.
CPC ......... *H10N 30/302* (2023.02); *B81B 3/0018* (2013.01); *H10N 30/50* (2023.02);
(Continued)

(58) Field of Classification Search
CPC .............................. H10N 30/80; H10N 30/50
(Continued)

(56) References Cited

U.S. PATENT DOCUMENTS

| 2004/0135144 A1 | 7/2004 | Yamada et al. |
| 2017/0263847 A1 | 9/2017 | Daoust et al. |

FOREIGN PATENT DOCUMENTS

| JP | 2002344279 A | 11/2002 |
| JP | 2005244184 A | 9/2005 |

(Continued)

OTHER PUBLICATIONS

ISA Japanese Patent Office, International Search Report Issued in Application No. PCT/JP2019/046052, dated Feb. 18, 2020, WIPO, 4 pages.

*Primary Examiner* — Derek J Rosenau
(74) *Attorney, Agent, or Firm* — McCoy Russell LLP

(57) ABSTRACT

There are provided a piezoelectric body of ytterbium-doped aluminum nitride, having a greater piezoelectric coefficient $d_{33}$ or $g_{33}$ than those not doped with ytterbium, and a MEMS device using the piezoelectric body. The piezoelectric body is represented by a chemical formula $Al_{1-x}Yb_xN$ where a value of x is more than 0 and less than 0.37 and having a lattice constant ratio c/a in a range of 1.53 or more and less than 1.6. The piezoelectric body with such a configuration has a greater piezoelectric coefficient $d_{33}$ or $g_{33}$ than those not doped with ytterbium.

10 Claims, 4 Drawing Sheets

(51) Int. Cl.
  *H10N 30/30* (2023.01)
  *H10N 30/50* (2023.01)
  *H10N 30/80* (2023.01)

(52) U.S. Cl.
  CPC ...... *H10N 30/80* (2023.02); *B81B 2201/0235* (2013.01); *B81B 2201/0242* (2013.01); *B81B 2201/0257* (2013.01); *B81B 2201/0264* (2013.01)

(58) Field of Classification Search
  USPC .......................................................... 310/358
  See application file for complete search history.

(56) References Cited

FOREIGN PATENT DOCUMENTS

| | | | |
|---|---|---|---|
| JP | 2009010926 | A | 1/2009 |
| JP | 2017201050 | A | 11/2017 |

| | X (Concentration of Yb) | c/a | d33 (pC/N) | εr | g33 ($10^{-3}$V·m/N) |
|---|---|---|---|---|---|
| Comparative example1 | 0.48 | 1.502 | 0.3 | 22.3 | 1.3 |
| Comparative example2 | 0.58 | 1.496 | 0.5 | 39.6 | 1.3 |
| Comparative example3 | 0.47 | 1.510 | 0.1 | 24.6 | 0.3 |
| Exsample1 | 0.14 | 1.579 | 9.2 | 14.2 | 73.1 |
| Exsample2 | 0.19 | 1.561 | 9.0 | 14.3 | 70.8 |
| Exsample3 | 0.02 | 1.594 | 7.2 | 9.6 | 85.3 |
| Exsample4 | 0.26 | 1.547 | 11.4 | 18.7 | 68.9 |
| Exsample5 | 0.31 | 1.536 | 11.9 | 18.9 | 71.0 |
| Exsample6 | 0.29 | 1.542 | 10.6 | 20.0 | 60.0 |
| Exsample7 | 0.22 | 1.562 | 10.0 | 14.7 | 76.8 |
| Exsample8 | 0.19 | 1.571 | 9.4 | 15.1 | 70.2 |
| Exsample9 | 0.24 | 1.547 | 9.8 | 16.0 | 69.1 |
| Exsample10 | 0.24 | 1.559 | 10.5 | 15.5 | 76.6 |
| Exsample11 | 0.21 | 1.561 | 10.2 | 15.4 | 75.0 |
| Exsample12 | 0.15 | 1.578 | 8.8 | 11.8 | 83.6 |
| Exsample13 | 0.21 | 1.561 | 10.1 | 15.7 | 72.5 |
| Exsample14 | 0.25 | 1.548 | 12.2 | 13.9 | 99.2 |
| Exsample15 | 0.09 | 1.577 | 9.2 | 10.1 | 102.4 |
| Exsample16 | 0.05 | 1.588 | 7.9 | 10.4 | 85.5 |
| Exsample17 | 0.32 | 1.535 | 12.0 | 19.3 | 70.3 |
| Comparative example4 | 0.37 | — | 0.1 | 18.4 | 0.4 |
| Exsample18 | 0.24 | 1.549 | 10.5 | 17.4 | 68.3 |
| Exsample19 | 0.30 | 1.536 | 12.0 | 19.2 | 70.6 |
| Exsample20 | 0.33 | 1.531 | 12.1 | 20.9 | 65.3 |
| Exsample21 | 0.09 | 1.578 | 7.4 | 10.6 | 79.1 |
| Exsample22 | 0.17 | 1.564 | 8.3 | 12.4 | 75.8 |
| Comparative example5 | 0.37 | 1.531 | 6.1 | 23.3 | 29.5 |
| Exsample23 | 0.02 | 1.590 | 7.1 | 8.1 | 98.7 |
| Exsample24 | 0.25 | 1.548 | 10.9 | 16.6 | 74.1 |
| Exsample25 | 0.29 | 1.564 | 11.3 | 21.2 | 60.1 |
| Exsample26 | 0.23 | 1.564 | 10.5 | 18.8 | 63.0 |
| Exsample27 | 0.33 | 1.562 | 11.5 | 28.4 | 45.7 |
| Exsample28 | 0.35 | 1.551 | 11.1 | 30.2 | 41.6 |
| Exsample29 | 0.29 | 1.571 | 10.8 | 24.2 | 50.4 |
| Exsample30 | 0.31 | 1.561 | 10.7 | 27.3 | 44.2 |
| Exsample31 | 0.28 | 1.577 | 10.0 | 22.3 | 50.7 |
| Comparative example6 | 0.00 | 1.601 | 6.5 | 10.0 | 65.0 |

FIG. 2

PIEZOELECTRIC BODY AND MEMS DEVICE USING SAME

CROSS REFERENCE TO RELATED APPLICATIONS

The present application is a U.S. National Phase of International Application No. PCT/JP2019/046052 entitled "PIEZOELECTRIC BODY AND MEMS DEVICE USING SAME," and filed on Nov. 26, 2019. International Application No. PCT/JP2019/046052 claims priority to Japanese Patent Application No. 2018-231681 filed on Dec. 11, 2018. The entire contents of each of the above-listed applications are hereby incorporated by reference for all purposes.

TECHNICAL FIELD

The present invention relates to a piezoelectric body of ytterbium-doped aluminum nitride and a MEMS device using the same.

BACKGROUND AND SUMMARY

Devices utilizing the piezoelectric phenomenon are used in various fields. For examples, the devices have been increasingly used in portable devices, such as cellular phones, which are strongly desired to be made smaller in size and minimize power consumption. Examples of the devices may include a filter using a film bulk acoustic resonator (FBAR) called an FBAR filter.

The FBAR filter is a filter based on a resonator that utilizes a thickness-longitudinal vibration mode of a thin film exhibiting a piezoelectric response and can resonate in gigahertz band. This kind of FBAR filter with such characteristics has a low loss and can be operated in a wide band. Thus, the FBAR filter is expected to further contribute to the operation at high frequencies and the reduction in size and power consumption of portable devices.

Examples of a piezoelectric material of such a piezoelectric thin film used for FBAR may include scandium-doped aluminum nitride (see Patent Literature 1) and ytterbium-doped aluminum nitride (see Patent Literatures 2 and 3). In particular, scandium-doped aluminum nitride has a high piezoelectric coefficient, so it is expected to be used in a next generation of high frequency filters. Further, it is expected to be used in physical sensors such as pressure sensors, acceleration sensors, and gyro sensors, and various micro electromechanical system (MEMS) devices such as actuators, microphones, fingerprint authentication sensors, and vibration power generators.

CITATION LIST

Patent Literature

Japanese Patent Application Laid-Open No. 2009-10926
Japanese Patent Application Laid-Open No. 2017-201050
U.S. Patent Application Publication No. 2017/0263847
Non-Patent Literature 1 "Revisiting the basics of vibration actuator with a view to a next generation sensor" by Shuji Tanaka, Sensor 22(2), 14-17 (2012), Japan Society of Next Generation Sensor Technology.

Technical Problem

However, since scandium (Sc) is an expensive rare earth element, manufacturing the piezoelectric body constituted by scandium-doped aluminum nitride (AlN) is more expensive than those constituted by other substances.

Aluminum nitride ($Al_{1-x}Yb_xN$; $0<x<1$) doped with ytterbium (Yb), instead of scandium, generally has a lower manufacturing cost than scandium-doped aluminum nitride. However, Patent Literature 2 describes that when the concentration value (x) is less than 0.1, there is no significant difference in electromechanical coupling coefficient between aluminum nitride not doped with ytterbium and ytterbium-doped aluminum nitride. In other words, the ytterbium-doped aluminum nitride cannot produce piezoelectric bodies with sufficient piezoelectric effects when the concentration value (x) of ytterbium is less than 0.1.

Further, according to Patent Literature 2, it becomes difficult to produce ytterbium-doped aluminum nitride ($Al_{1-x}Yb_xN$) with a concentration value (x) greater than 0.27. Thus, there is a problem in which the piezoelectric body with the concentration value (x) of ytterbium greater than 0.27 cannot be produced.

Moreover, in Patent Literature 2, the performance of the piezoelectric thin film is evaluated by using only the electromechanical coupling coefficient ($k^2$). However, as described in Non-Patent Literature 1, the performance of the piezoelectric thin film should be evaluated against the performance index of each type of MEMS device. For example, when the piezoelectric thin film is used as an actuator or a sensor, piezoelectric coefficients such as the level of strain caused by applying a voltage, i.e. d constant, and the voltage caused by applying a pressure, i.e. g constant, need to be evaluated. Thus, there has been a problem in which it is unclear if the piezoelectric thin film disclosed in Patent Literature 2 can actually be used as a sensor.

Further, in Patent Literature 2, a granular target of ytterbium is disposed on a planar target of aluminum to form an ytterbium-doped aluminum nitride thin film. In this process, the granular target of ytterbium to be used for film formation is oxidized on its surface. In this case, even if it is attempted to peel off any oxide film formed on the surface of the granular target before performing film formation, the oxide film cannot be completely removed because the target is not planar. As a result, the target with at least a part of the oxide film remained on the surface thereof is used for film formation. The oxide film affects the crystal structure (e.g. a lattice constant ratio c/a, etc.) of the ytterbium-doped aluminum nitride thin film. If the step of removing any oxide film is omitted, its effect becomes even greater.

Although the details will be described later, the inventor of the present invention has actually formed a piezoelectric body with a concentration value (x) of ytterbium greater than 0.27 and clarified that the resulting piezoelectric body thus has a high piezoelectric coefficient. This clearly shows that the ytterbium-doped aluminum nitride disclosed in Patent Literature 2 and the ytterbium-doped aluminum nitride according to the present invention are different in crystal structure.

Further, Patent Literature 3 discloses that simulations using density functional theory (DFT) were performed to find that ytterbium-doped aluminum nitride ($Al_{1-x}Yb_xN$) having ytterbium doped in a concentration range of 10 to 60% increases the piezoelectric coefficient upon being subjected to tensile stress (200 MPa to 1.5 GPa). However, it only discloses the piezoelectric coefficient $d_{33}$ of ytterbium-doped aluminum nitride ($Al_{1-x}Yb_xN$) with the concentration x of 0.5. Further, this piezoelectric coefficient $d_{33}$ is calculated on the basis of the simulation result. Thus, considering that the maximum concentration x of ytterbium in aluminum nitride is 0.27, as disclosed in the aforementioned Patent Literature 2, there remains a problem in that it is unclear whether the piezoelectric thin film can be actually produced by using aluminum nitride ($Al_{0.5}Yb_{0.5}N$) doped with ytterbium at this concentration (0.5) or, if so, whether such a piezoelectric thin film exhibits this piezoelectric coefficient value.

The present invention was made in view of the aforementioned circumstances and has as its object the provision of a piezoelectric body of ytterbium-doped aluminum nitride, having a greater piezoelectric coefficient $d_{33}$ or $g_{33}$ than piezoelectric bodies of aluminum nitride not doped with ytterbium, and a MEMS device using the piezoelectric body.

Solution to Problem

As a result of persistent intensive studies on the aforementioned problems, the inventor of the present invention has found that ytterbium-doped aluminum nitride having a lattice constant ratio c/a within a specific range has a high piezoelectric coefficient $d_{33}$ or $g_{33}$, thereby discovering the following innovative piezoelectric body.

A first aspect of the present invention for solving the aforementioned problems is a piezoelectric body represented by a chemical formula $Al_{1-x}Yb_xN$ where a value of x is more than 0 and less than 0.37 and having a lattice constant ratio c/a in a range of 1.53 or more and less than 1.6.

The term "piezoelectric body" used herein refers to a substance having a property of causing a potential difference in response to a mechanical force applied thereto or a property of causing deformation in response to a potential difference applied thereto, i.e. a piezoelectric property (piezoelectric response).

Further, in crystals like wurtzite-type crystals and other hexagonal crystal systems, the "lattice constant ratio c/a" is calculated by dividing the length of a longer side c among the lengths of lattice edges a and c (lengths of lattice sides) in a unit lattice by the length of a shorter side a.

In this first aspect, the piezoelectric bodies of aluminum nitride doped with ytterbium can have a greater piezoelectric coefficient $d_{33}$ or $g_{33}$ than those not doped with ytterbium.

Note that, when x is 0, aluminum nitride is the same as not being doped with ytterbium, and, when x is 0.37 or more, the piezoelectric coefficient $d_{33}$ becomes lower than that of aluminum nitride not doped with ytterbium.

Further, when the lattice constant ratio c/a is 1.6 or more, the piezoelectric coefficient $d_{33}$ is less than that of aluminum nitride not doped with ytterbium. When the lattice constant ratio c/a is less than 1.53, the piezoelectric coefficient $d_{33}$ is less than that of aluminum nitride not doped with ytterbium.

A second aspect according to the present invention is the piezoelectric body described in the first aspect, wherein the value of x is within a range of more than 0.27 and less than 0.37.

In this second aspect, the piezoelectric bodies of aluminum nitride doped with ytterbium can have a much greater piezoelectric coefficient $d_{33}$ or $g_{33}$ than those not doped with ytterbium.

A third aspect according to the present invention is the piezoelectric body described in the second aspect, wherein the lattice constant ratio c/a is within a range of 1.53 or more and 1.555 or less.

In this third aspect, the piezoelectric bodies of aluminum nitride doped with ytterbium can have a further greater piezoelectric coefficient $d_{33}$ or $g_{33}$ than those not doped with ytterbium.

A fourth aspect according to the present invention is the piezoelectric body described in the first aspect, wherein the value of x is within a range of more than 0 and less than 0.1.

In this fourth aspect, the piezoelectric bodies of aluminum nitride doped with ytterbium can have a greater piezoelectric coefficient $d_{33}$ or $g_{33}$ than those not doped with ytterbium.

A fifth aspect according to the present invention is the piezoelectric body described in the fourth aspect, wherein the lattice constant ratio c/a is within a range of 1.57 or more and less than 1.6.

In this fifth aspect, the piezoelectric bodies of aluminum nitride doped with ytterbium can have a greater piezoelectric coefficient $d_{33}$ or $g_{33}$ than those not doped with ytterbium.

A sixth aspect according to the present invention is a piezoelectric body wherein the piezoelectric body described in any one of the first to fifth aspects is disposed on a substrate and at least one intermediate layer is disposed between the piezoelectric body and the substrate.

In this sixth aspect, the crystallinity (degree of crystallization) of the piezoelectric body improves. Thus, the piezoelectric bodies of aluminum nitride doped with ytterbium can have a further greater piezoelectric coefficient $d_{33}$ or $g_{33}$ than those not doped with ytterbium.

A seventh aspect according to the present invention is the piezoelectric body described in the sixth aspect, wherein the intermediate layer includes at least one of aluminum nitride, gallium nitride, indium nitride, titanium nitride, scandium nitride, ytterbium nitride, molybdenum, tungsten, hafnium, titanium, ruthenium, ruthenium oxide, chromium, chromium nitride, platinum, gold, silver, copper, aluminum, tantalum, iridium, palladium, and nickel.

In this seventh aspect, the crystallinity (degree of crystallization) of the piezoelectric body improves. Thus, the piezoelectric bodies can have a further greater piezoelectric coefficient $d_{33}$ or $g_{33}$ than those not doped with ytterbium.

An eighth aspect of the present invention is the piezoelectric body described in the sixth or seventh aspect. Here, a diffusion layer is further disposed between the intermediate layer and the piezoelectric body, and the diffusion layer includes a substance constituting the intermediate layer and a substance constituting the piezoelectric body.

In this eighth aspect, the same effects as those in the sixth and seventh aspects can be obtained.

A ninth aspect of the present invention is a MEMS device using the piezoelectric body described in any one of the first to eighth aspects.

The "MEMS device" used herein is not particularly limited as long as it is a micro electromechanical system, and examples thereof may include physical sensors, such as pressure sensors, acceleration sensors, and gyro sensors, actuators, microphones, fingerprint authentication sensors, and vibration power generators.

In this ninth aspect, the MEMS devices can operate at high frequencies and be reduced in size and power consumption. In particular, in a case where the MEMS device is a sensor, it is possible to provide a sensor exhibiting a lower loss and operable in a wider band as compared with conventional sensors.

BRIEF DESCRIPTION OF THE FIGURES

FIG. 2 is a table showing a concentration of Yb, a lattice constant ratio c/a, and a piezoelectric coefficient $d_{33}$ of each thin film.

DETAILED DESCRIPTION

Hereinafter, embodiments relating to thin films of piezoelectric bodies according to the present invention will be described with reference to the accompanying drawings. Note that, needless to say, the present invention is not limited to the following embodiments and the piezoelectric body may not be formed in a thin film shape.

First Embodiment

Figure 1:
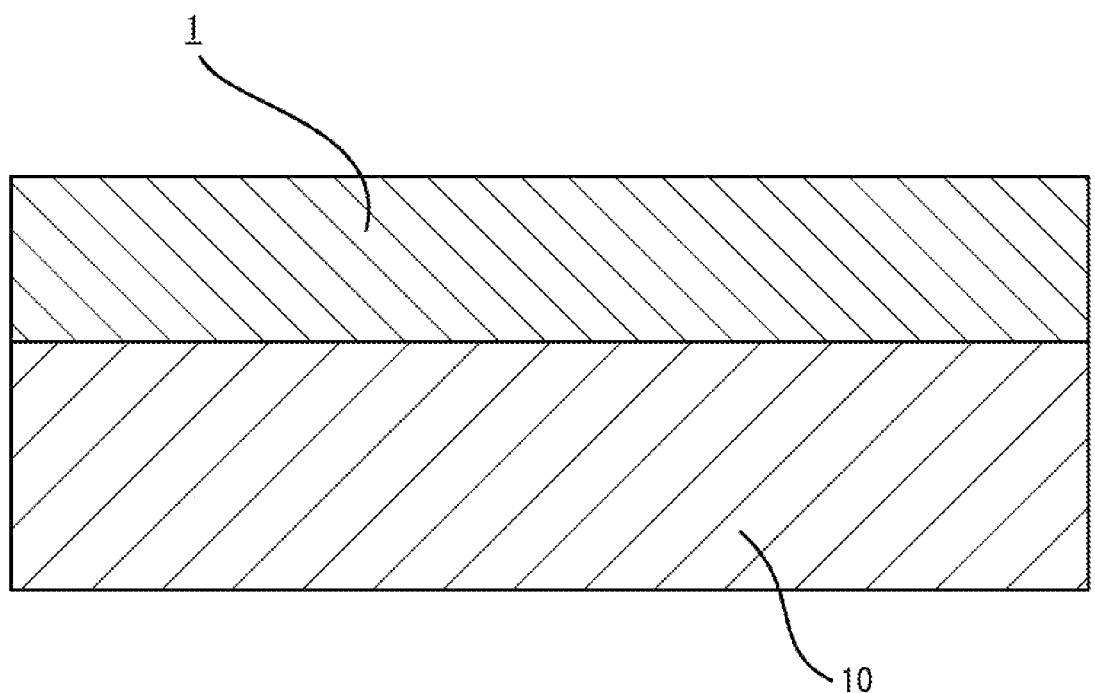
FIG. 1 is a schematic side view of a piezoelectric thin film according to a first embodiment.

FIG. 1 is a schematic side view of a piezoelectric thin film according to the present embodiment. As illustrated in this drawing, a piezoelectric thin film 1 is formed on a substrate 10. The thickness of the piezoelectric thin film is not particularly limited. However, it is preferably within a range of 0.1 to 30 μm, and particularly preferably within a range of 0.1 to 2 μm for exhibiting excellent adhesion.

Note that the thickness, material, etc. of the substrate 10 are not particularly limited as long as the piezoelectric thin film 1 can be formed on the surface of the substrate 10. Examples of the substrate 10 may include a silicon substrate, a heat resistant alloy substrate such as Inconel, and a resin film such as a polyimide.

The piezoelectric thin film 1 is constituted by ytterbium (Yb)-doped aluminum nitride, which is represented by a chemical formula $Al_{1-x}Yb_xN$ where a value of x is more than 0 and less than 0.37, and has a lattice constant ratio c/a within a range of 1.53 or more and less than 1.6. The piezoelectric thin film with such a configuration has a greater piezoelectric coefficient $d_{33}$ or $g_{33}$ than piezoelectric thin films of aluminum nitride not doped with ytterbium.

Further, in the aforementioned chemical formula, the value of x is preferably within a range of more than 0.27 and less than 0.37. The piezoelectric thin film 1 with such a configuration has the greater piezoelectric coefficient $d_{33}$ or $g_{33}$.

Further, it is particularly preferable that, in the aforementioned chemical formula, the value of x is within a range of more than 0.27 and less than 0.37 and the lattice constant ratio c/a is within a range of 1.53 or more and 1.555 or less. The piezoelectric thin film 1 with such a configuration has the particularly high piezoelectric coefficient $d_{33}$ or $g_{33}$.

On the other hand, in the aforementioned chemical formula, the value of x is preferably within a range of more than 0 and less than 0.1. The piezoelectric thin film 1 with such a configuration has the greater piezoelectric coefficient $d_{33}$ or $g_{33}$ than aluminum nitride not doped with ytterbium, despite having been doped with less ytterbium.

Further, it is particularly preferable that, in the aforementioned chemical formula, the value of x is within a range of more than 0 and less than 0.1 and the lattice constant ratio c/a is within a range of 1.57 or more and less than 1.6. The piezoelectric thin film 1 with such a configuration has sufficiently high piezoelectric coefficient $d_{33}$ or $g_{33}$ despite having been doped with less ytterbium.

Furthermore, sensors using these piezoelectric thin films 1 exhibit a low loss and can be operated in a wide band. As a result, portable devices that use the piezoelectric thin films can operate at high frequencies and are more compact and power efficient. Note that the configuration of the sensor is not particularly limited, and any known configuration of sensor is compatible for manufacturing.

Next, a method for producing the piezoelectric thin film according to the present embodiment will be described. The piezoelectric thin film 1 can be produced using methods such as a sputtering method and a deposition method in the same manner as for a general piezoelectric thin film. Specifically, for example, it can be produced by a sputtering treatment in which an ytterbium target and an aluminum target are simultaneously sputtered on the substrate 10 (e.g., a silicon (Si) substrate) under a nitrogen gas ($N_2$) atmosphere or a mixed atmosphere of nitrogen gas ($N_2$) and argon gas (Ar) (with a gas pressure of 1 Pa or less). Note that an alloy containing ytterbium and aluminum in a specific ratio may be used as a target.

EXAMPLES AND COMPARATIVE EXAMPLES

The apparatus, sputtering targets, etc. described below were used to produce a plurality of piezoelectric thin films of ytterbium-doped aluminum nitride. Each piezoelectric thin film formed on an n-type silicon substrate with a specific resistance of 0.02 Ωcm had a thickness of 0.4 to 1.5 μm.

Sputtering apparatus: BC3263 (manufactured by ULVAC)
Ytterbium sputtering target material (concentration: 99.999%)
Aluminum sputtering target material (concentration: 99.999%)
Gas: mixed gas of nitrogen (purity: 99.99995% or higher) and argon gas (purity: 99.9999% or higher) (mixing ratio 40:60)
Substrate heating temperature: 300 to 600° C.

Film forming experiments were performed after the air pressure inside a sputtering chamber was reduced to a high vacuum state of $10^{-6}$ or lower using a vacuum pump. Further, the target surface was subjected to a cleaning treatment immediately after the installation of the targets and immediately before each film forming experiment in order to prevent contamination by impurities such as oxygen.

FIG. 2 shows the concentration of ytterbium (Yb), the lattice constant ratio (c/a), $d_{33}$, the specific dielectric constant $\varepsilon_r$, and $g_{33}$ of each piezoelectric thin film obtained. In this figure, the lattice constant ratio c/a was calculated using an X-ray diffractometer (SmartLab manufactured by Rigaku Corp.), and the piezoelectric coefficient $d_{33}$ and capacitance were measured using a piezometer (PM300 manufactured by Piezotest Pte Ltd.). These values were used to calculate the specific dielectric constant $\varepsilon_r$ and $g_{33}$. Note that the Yb concentration (x) was obtained by taking the average of measurements at 5 or more points in each sample using an EDX device (an energy dispersive X-ray spectrometer EX-420, manufactured by Horiba, Ltd.) inside a scanning electron microscope (S-4300 manufactured by Hitachi High-Tech Corp.). An error of x in the measurement was about ±0.003.

Figure 3:
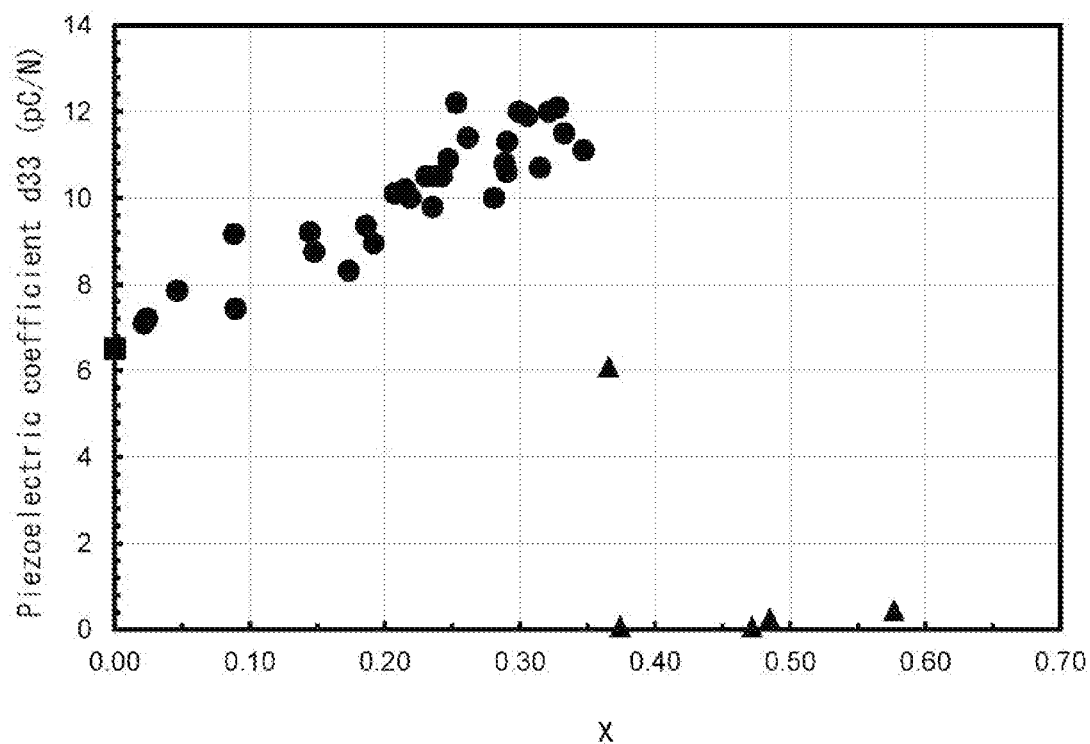
FIG. 3 is a graph showing the relation between the concentration of ytterbium and the piezoelectric coefficient $d_{33}$ in Examples of the first embodiment and Comparative examples.
Figure 4:
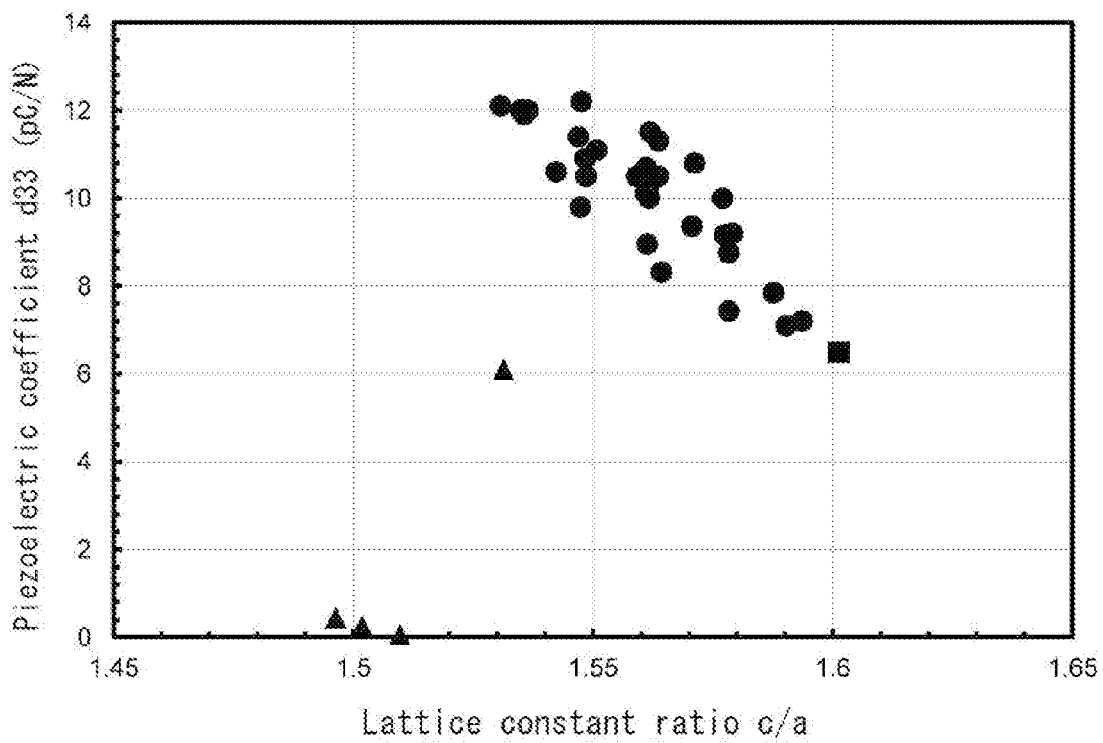
FIG. 4 is a graph showing the relation between the lattice constant ratio c/a and the piezoelectric coefficient $d_{33}$ in Examples of the first embodiment and Comparative examples.

Further, a graph showing the relation between the concentration x of ytterbium and the piezoelectric coefficient $d_{33}$ is shown in FIG. 3 and a graph showing the relation between the lattice constant ratio (c/a) and the piezoelectric coefficient $d_{33}$ is shown in FIG. 4.

In the graphs, square plotted points indicate results of aluminum nitride not doped with ytterbium, circle plotted points indicate results of Examples, and triangle plotted points indicate results of Comparative examples.

As evident from these graphs, it was found that the piezoelectric coefficient $d_{33}$ of the piezoelectric thin film in which the value of x in the aforementioned chemical formula was more than 0 and less than 0.37 and the lattice constant ratio c/a was in a range of 1.53 or more and less than 1.6 was greater than that of the piezoelectric thin film of aluminum nitride not doped with ytterbium.

Further, the graph shows that the piezoelectric thin film in which the value of x in the aforementioned chemical formula was in a range of more than 0.27 and less than 0.37 and the lattice constant ratio c/a was in a range of 1.53 or more and 1.555 or less had the particularly high piezoelectric coefficient $d_{33}$.

Further, the graph shows that the piezoelectric thin film in which the value of x was in a range of more than 0 and less than 0.1 and the lattice constant ratio c/a was in a range of 1.57 or more and less than 1.6 had the sufficiently high piezoelectric coefficient $d_{33}$ despite having been doped with less ytterbium.

Second Embodiment

Figure 5:
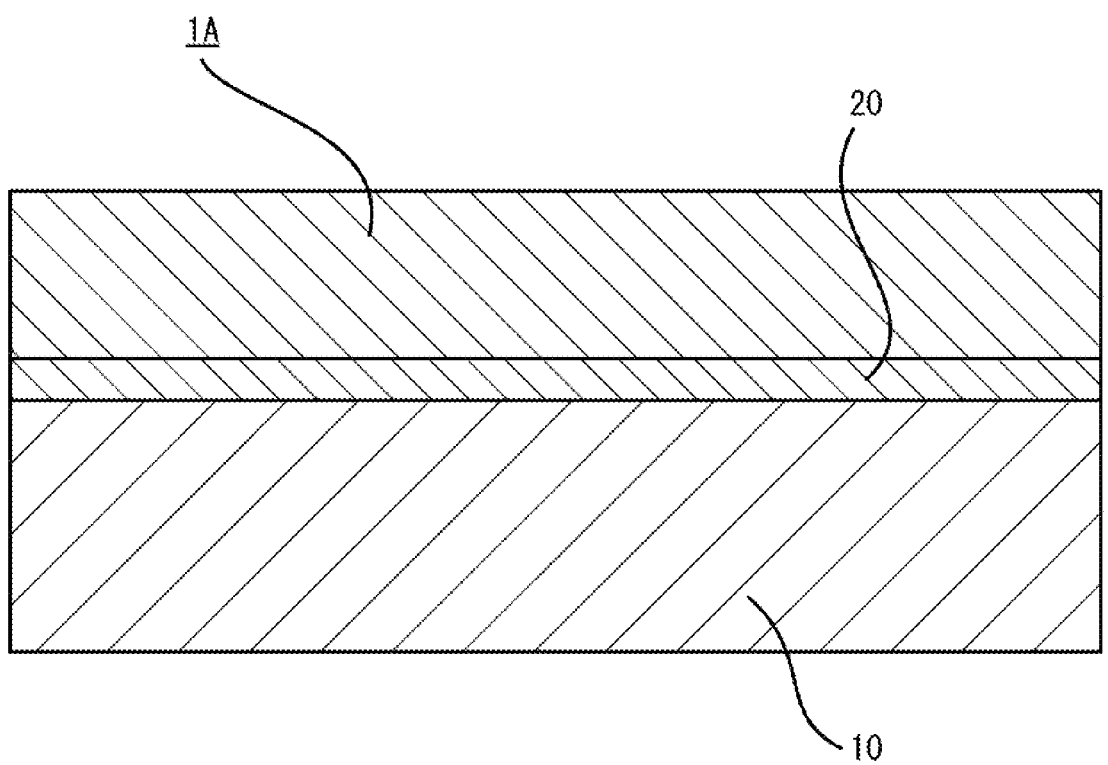
FIG. 5 is a schematic side view of a piezoelectric thin film according to a second embodiment.

In the aforementioned first embodiment, the piezoelectric thin film was produced directly on the substrate. However, the present invention is not limited thereto. For example, as shown in FIG. 5, an intermediate layer 20 may be disposed between the substrate 10 and a piezoelectric thin film 1A.

In this configuration, the material, the thickness, etc. of the intermediate layer 20 are not particularly limited as long as the piezoelectric thin film 1A can be formed on the intermediate layer 20. Examples of the intermediate layer may include layers having a thickness of 50 to 200 nm constituted by aluminum nitride (AlN), gallium nitride (GaN), indium nitride (InN), titanium nitride (TiN), scandium nitride (ScN), ytterbium nitride (YbN), molybdenum (Mo), tungsten (W), hafnium (Hf), titanium (Ti), ruthenium (Ru), ruthenium oxide ($RuO_2$), chromium (Cr), chromium nitride, platinum (Pt), gold (Au), silver (Ag), copper (Cu), aluminum (Al), tantalum (Ta), iridium (Ir), palladium (Pd), and nickel (Ni).

Disposing a layer like the intermediate layer 20 on the substrate 10 improves the crystallinity (degree of crystallization) of the piezoelectric thin film. Thus, the piezoelectric thin film of ytterbium-doped aluminum nitride can have the further greater piezoelectric coefficients $d_{33}$ or $g_{33}$ than those not doped with ytterbium.

Third Embodiment

In the aforementioned second embodiment, the piezoelectric thin film was formed directly on the intermediate layer. However, the present invention is not limited thereto. For example, a diffusion layer may be further disposed between the intermediate layer and the piezoelectric thin film. The diffusion layer includes a substance a substance constituting the intermediate layer and a substance constituting the piezoelectric thin film. Note that the diffusion layer can be formed by, for example, forming the piezoelectric thin film on the intermediate layer and then heating the resulting product. The same effects as that in the second embodiment can be obtained when the diffusion layer is disposed in this manner.

REFERENCE SIGNS LIST 1, 1A piezoelectric thin film
10 substrate
20 diffusion layer

The invention claimed is:

1. A nitride material represented by a chemical formula $Al_{1-x}Yb_xN$ where a value of x is more than 0 and less than 0.37 and having a lattice constant ratio c/a in a range of 1.53 or more and less than 1.6.

2. The nitride material according to claim 1, wherein the value of x is within a range of more than 0.27 and less than 0.37.

3. The nitride material according to claim 2, wherein the lattice constant ratio c/a is within a range of 1.53 or more and 1.555 or less.

4. The nitride material according to claim 1, wherein the value of x is within a range of more than 0 and less than 0.1.

5. The nitride material according to claim 4, wherein the lattice constant ratio c/a is within a range of 1.57 or more and less than 1.6.

6. The piezoelectric body comprising the nitride material according to claim 1.

7. A piezoelectric body wherein the piezoelectric body according to claim 6 is disposed on a substrate, and at least an intermediate layer is disposed between the piezoelectric body and the substrate.

8. The piezoelectric body according to claim 7, wherein the intermediate layer includes at least one of aluminum nitride, gallium nitride, indium nitride, titanium nitride, scandium nitride, ytterbium nitride, molybdenum, tungsten, hafnium, titanium, ruthenium, ruthenium oxide, chromium, chromium nitride, platinum, gold, silver, copper, aluminum, tantalum, iridium, palladium, and nickel.

9. The piezoelectric body according to claim 7, wherein a diffusion layer is further disposed between the intermediate layer and the piezoelectric body, the diffusion layer including a substance constituting the intermediate layer and a substance constituting the piezoelectric body.

10. A MEMS devise using the piezoelectric body according to claim 6.

* * * * *